(12) United States Patent
Shiao

(10) Patent No.: US 6,242,983 B1
(45) Date of Patent: Jun. 5, 2001

(54) CONTROL CIRCUIT OF VARIABLE CURRENT SOURCE IN PROGRAMMABLE GAIN AMPLIFIER

(75) Inventor: Chi-Ming Shiao, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/439,434

(22) Filed: Nov. 15, 1999

(51) Int. Cl.[7] .................................................. H03G 3/10
(52) U.S. Cl. ........................ 330/285; 330/288; 330/296
(58) Field of Search .................................. 330/285, 288, 330/296, 261

(56) References Cited

U.S. PATENT DOCUMENTS

| | | | |
|---|---|---|---|
| 5,757,236 | * | 5/1998 | Ortiz et al. ............................ 330/296 |
| 5,912,589 | * | 6/1999 | Khoury et al. ....................... 330/261 |
| 6,043,714 | * | 3/2000 | Yamamoto ........................... 330/296 |

* cited by examiner

Primary Examiner—Michael B Shingleton

(57) ABSTRACT

A control circuit employed in a programmable gain amplifier disclosed herein, the control circuit in one preferred embodiment of the present invention includes the following devices. The reference voltage generating circuits is to provide a voltage level for the first current generating device, and then the first current generating device produces a first current. The current repeating device generates a first repeating current with the same magnitude as the first current. In addition, the current repeating device is the current mirror of the current sources in the programmable gain amplifier to generate the second repeating current, the third repeating current and so forth. The magnitude of the second repeating current (and the subsequent bias current) is in proportional to that of the first repeating current as well as to that of the first current. An adjustable resistor, which is the emitter resistor of the first current generating device, can be varied to control the first current. Since the current through the adjustable resistor can be linearly controlled, the bias current in the programmable gain amplifier is linearly controlled without using any feed back circuit.

22 Claims, 3 Drawing Sheets

<Prior Art>

US 6,242,983 B1

CONTROL CIRCUIT OF VARIABLE CURRENT SOURCE IN PROGRAMMABLE GAIN AMPLIFIER

BACKGROUND OF THE INVENTION

1. Field of the Invention

This invention relates to a control circuit employed in a bias circuit of a cascaded amplifier, especially relates to a control circuit employed in a bias circuit of a programmable gain amplifier (PGA).

2. Description of the Prior Art

The differential amplifier is utilized as the control circuit employed in a bias circuit of a programmable gain amplifier. The output voltage of the differential amplifier controls the drain current of a switch made up of the PMOS (P-type Metal Oxide Semiconductor) transistor. In addition, the magnitude of the source voltage of the PMOS transistor is fed back to one input terminal of the differential amplifier. The other input terminal of the differential amplifier is connected to the output terminal of a digital-to-analog converter. It is this feedback mechanism which controls the drain current of the PMOS switch and hereby the collector current of the current source below it.

The gain control of traditional programmable gain amplifier may be done through the control of biasing current for each gain stage. Referring to FIG. 1, when the traditional control circuit 10 is in operation, the control circuit 10 is electrically coupled to the programmable gain amplifier 12 to provide the bias current of the programmable gain amplifier 12. The control circuit 10 includes the operational amplifier 14, with the positive input terminal connected to the output terminal of the digital-to-analog converter. In addition, the output terminal of the operational amplifier 14 is connected to the gate of the transistor 16, which is a PMOS transistor in the traditional control circuit 10.

The source of transistor 16 is simultaneously connected to a resistor and to the negative input terminal of the operational amplifier 14. The drain of transistor 16 is connected to base of the first bipolar transistor 18, and then is connected to the collector of the second bipolar transistor 20. The emitter of the second bipolar transistor 20 is coupled through a resistor to voltage $V_{EE}$. The base of the second bipolar transistor 20 is shorted to the emitter of the first bipolar transistor 18 and then is coupled to the programmable gain amplifier 12 to provide the bias current 1.

The conventional schematic utilized to control the current for the programmable gain amplifier has the following disadvantages. First, the stability problem arises from the feedback circuit has to be paid special attention during the design phase. Secondly, the PMOS transistor (transistor 16) as a voltage control current source used in the conventional control circuit is operated in the triode region. The equivalent channel resistance is a nonlinear parameter which is sensitive to the process variation. In addition, the schematic diagram is more complex and needs more layout space.

SUMMARY OF THE INVENTION

As described in the prior art, the bias current of a programmable gain amplifier is controlled by a feedback mechanism made up of a PMOS device and a differential amplifier. The output of differential amplifier controls the turn-on condition of PMOS device whose source voltage is fed back to the amplifier input to adjust the control voltage range. The disadvantage of this feedback circuit design is that stability problem always has to be checked carefully. In addition, the PMOS transistor in the conventional control circuit is designed to operate in the triode region. The equivalent channel resistance is a non-linear parameter which easily suffers from the process variation and causes the error of control accuracy. Furthermore, the circuit layout of the prior art technique occupies more layout space because of its complexity.

The present invention is to linearly and precisely controls the biasing condition of the programmable gain amplifier. In addition, the present invention can avert the instability issue of the feed back circuit. The present invention can also minimize the error of current control caused by the process variation.

According to the purposes mentioned above, the present invention proposes a control circuit to provide bias current for a programmable gain amplifier. The control circuit according to one preferred embodiment of the present invention includes the reference voltage generating circuits, the first current generating device, and the current repeating device.

The function of the reference voltage generating circuits is to generate a reference voltage level to provide the base bias of the first current generating device and turn on the device. Thus, the first current generating device generates a first current between the collector and emitter of the device. The emitter of the first current generating device is connected to the first voltage level through a first control resistor. The first current generating device mentioned above can be made of bipolar junction transistor (BJT).

The current repeating device acts as a current mirror of the current sources in the programmable gain amplifier. The second control electrode of the current repeating device is connected to a current gain transistor and to the current repeating devices in the programmable amplifier to generate the bias current for the gain stages. The first electrode of the first current generating device and the third electrode of the current repeating device is electrically connected to a loaded current mirror. The collector current of the first current repeating device is the first repeating current. The first repeating current acts as the source current of the bias current sources in the programmable gain amplifier to generate the second repeating current, the third repeating current, and so forth. The magnitude of the second repeating current is proportional in magnitude to the first repeating current and the first current. The second repeating current is the bias current of gain stages in the programmable gain amplifier.

The first current generating device in one preferred embodiment of the present invention is a NPN BJT. The current repeating device is also a NPN BJT. The first electrode of the first current generating device is the collector of the transistor, the second electrode of the first current generating device is the emitter of the transistor, the first control electrode of the first current generating device is the base of the transistor. The current repeating transistor of the programmable gain amplifier being a current source. The current repeating transistors of the programmable gain amplifier mentioned above are NPN BJTs. The collector of the current gain transistor mentioned above is coupled to a second voltage level. The second voltage level is also coupled to the source of the field effect transistor as active load mentioned above.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Because of the bias circuit of the conventional programmable gain amplifier has the destined disadvantages resulted from the circuit design of its control circuit, the present invention propose a control circuit of the bias circuit of the programmable gain amplifier without using feedback circuit. So the control circuit in the present invention can precisely control the produced current and avoid the instability of the circuit itself. In addition, the present invention can avert the error of the produced current resulted from the process variation. Besides, the circuit diagram of control circuit in the present invention is simple in nature, so the layout space can be reduced.

Figure 1:
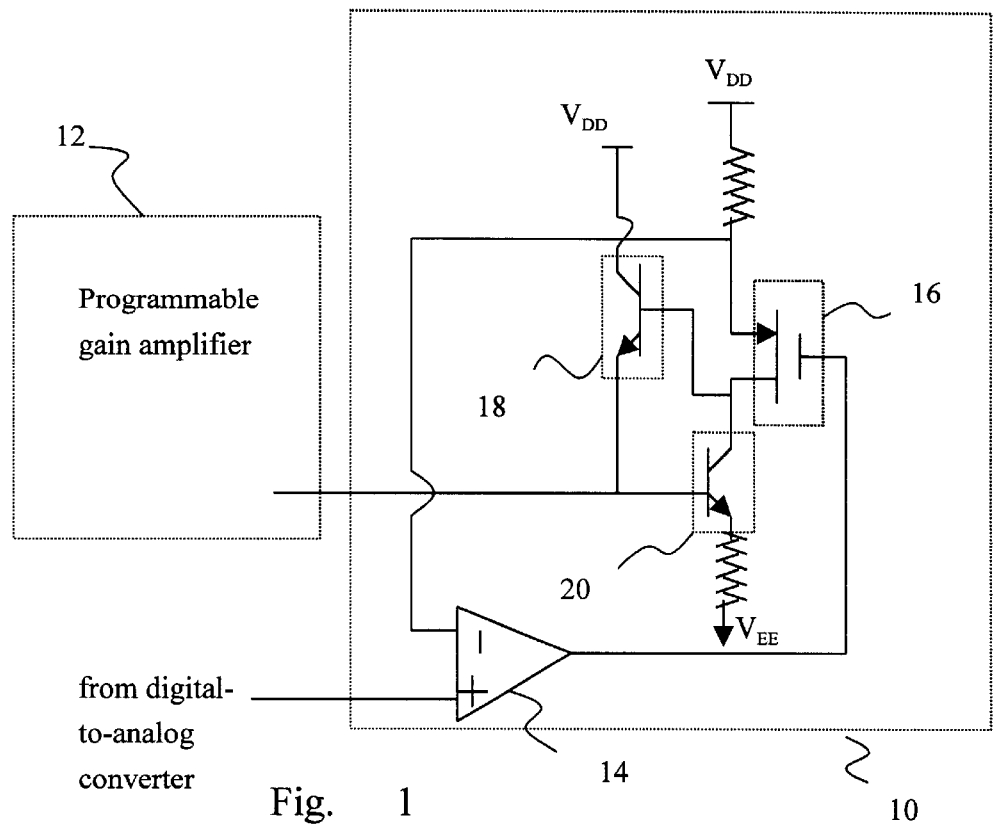
FIG. 1 illustrates the circuit diagram of the conventional control circuit employed in the programmable gain amplifier.
Figure 2:
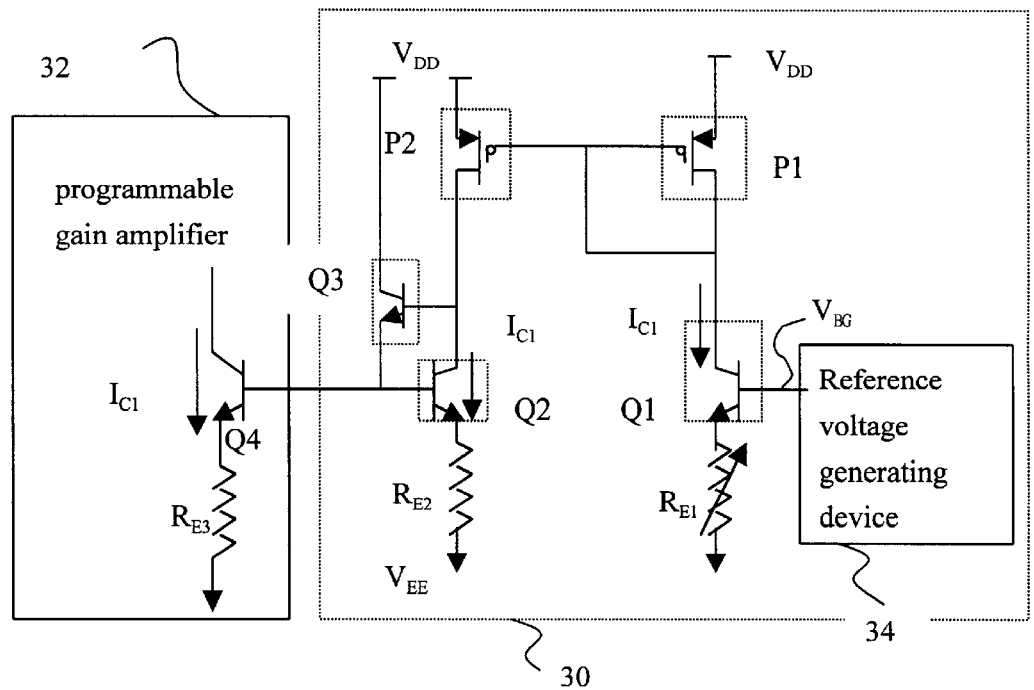
FIG. 2 illustrates the circuit diagram of the control circuit according to one preferred embodiment of the present invention employed in the programmable gain amplifier.

The present invention proposes the control circuit that can be used in the biasing circuit of the programmable gain amplifier. The gain control of a programmable gain amplifier can be done through the control of bias current of gain stages in the amplifier. Referring to FIG. 2, the control circuit 30 is electrically coupled to the programmable gain amplifier 32 to provide bias current for the biasing circuit of the programmable gain amplifier 32. One preferred embodiment of the present invention is implemented by the BiCMOS technology. The base voltage of the first transistor Q1 is provided by the reference voltage generating circuits 34, which has well-controlled temperature coefficient.

In the present invention, the reference voltage generating circuits 34 is a band gap reference (BGR), that is used to provide a stable and less temperature dependent voltage, and the voltage is typically 1.2 volts in one preferred embodiment of the present invention. The base of the first transistor Q1 is electrically connected to the reference voltage generating circuits 34, hence the base-emitter junction of the first transistor Q1 is forward biased and turn on. The emitter of the first transistor Q1 is electrically coupled through the emitter resistor $R_{E1}$ to the voltage $V_{EE}$. The collector of the first transistor Q1 is electrically connected to the drain and gate of the first MOSFET (Metal Oxide Semiconductor Field Effect Transistor) P1, and the source of the first MOSFET P1 is shorted to the supply voltage $V_{DD}$. The gate of diode connected MOSFET P1 is electrically connected to the gate of the second MOSFET P2 to form a current mirror, and the source of the second MOSFET P2 is electrically connected to the supply voltage $V_{DD}$. The drain of the second MOSFET P2 is electrically coupled to both the collector of the second transistor Q2 and the base of the third transistor Q3.

Transistors Q2, Q3, and Q4 including the emitter degeneration resistors $R_{E2}$, $R_{E3}$ form the current mirror for the current sources in the programmable gain amplifier. The collector of the third transistor Q3 is electrically connected to the drain voltage $V_{DD}$, and the emitter of the second transistor Q2 is connected to the emitter voltage $V_{EE}$ through the second emitter resistor $R_{E2}$. The emitter of the third transistor Q3 is electrically connected to the base of the second transistor Q2, and is further connected to the base of the fourth transistor Q4 in the programmable gain amplifier 32. The emitter of the fourth transistor Q4 is coupled to the emitter voltage $V_{EE}$ through the third emitter resistor $R_{E3}$. It is noted that both the fourth transistor Q4 and the third emitter resistor $R_{E3}$ are not a portion of the control circuit proposed by the present invention. The fourth transistor Q4 and the third emitter resistor $R_{E3}$ constitute one of the current source in the amplifier. In one preferred embodiment of the present invention, the first emitter resistor $R_{E1}$ is an adjustable resistor (variable resistor). The resistance of the first emitter resistor $R_{E1}$ can be optionally adjusted to control the collector current $I_{C1}$ of the first transistor Q1.

Through the current mirror composed of the first MOSFET P1 and the second MOSFET P2, the collector current $I_{C1}$ (as the reference current) of the first transistor Q1 is repeated (regenerated) as the repeated current (the image current) of the second transistor Q2. The image current has the same magnitude as the collector current $I_{C1}$ of the first transistor Q1. The second transistor Q2 and $R_{E2}$ are the current mirror of the current sources in the programmable gain amplifier. The transistor Q3 inserted between the collector and base of Q2 provides the current gain for the subsequent current sources in the amplifier.

Because the collector current $I_{C1}$ can be varied by adjusting the value of the first emitter resistor $R_{E1}$ of the first transistor Q1. The magnitude of the bias current provided for the programmable gain amplifier is then changed and in proportional to that of the collector current $I_{C1}$ of the first transistor. Therefore, by precisely control the collector current of the first transistor, the gain of programmable gain amplifier can be varied.

In one preferred embodiment of the present invention, the first MOSFET P1 and the second MOSFET P2 are P channel MOSFET devices. The first transistor Q1, the second transistor Q2, the third transistor Q3, and the fourth transistor Q4 are made of NPN bipolar transistor. However, any type of transistor can be employed in the present invention to replace the types of transistor mentioned above, and the connection of the transistors can be replaced, only if the transistor and the connection between themselves can do the same function of current mirror. In other words, either the circuit diagram or the type of transistor employed in the present invention is not confined to the preferred embodiment of the present invention. Besides, although the output voltage of the reference voltage generating circuits 34 is equal to 1.2 volts in one preferred embodiment of the present invention, the output voltage can be different value if necessary.

Figure 3:
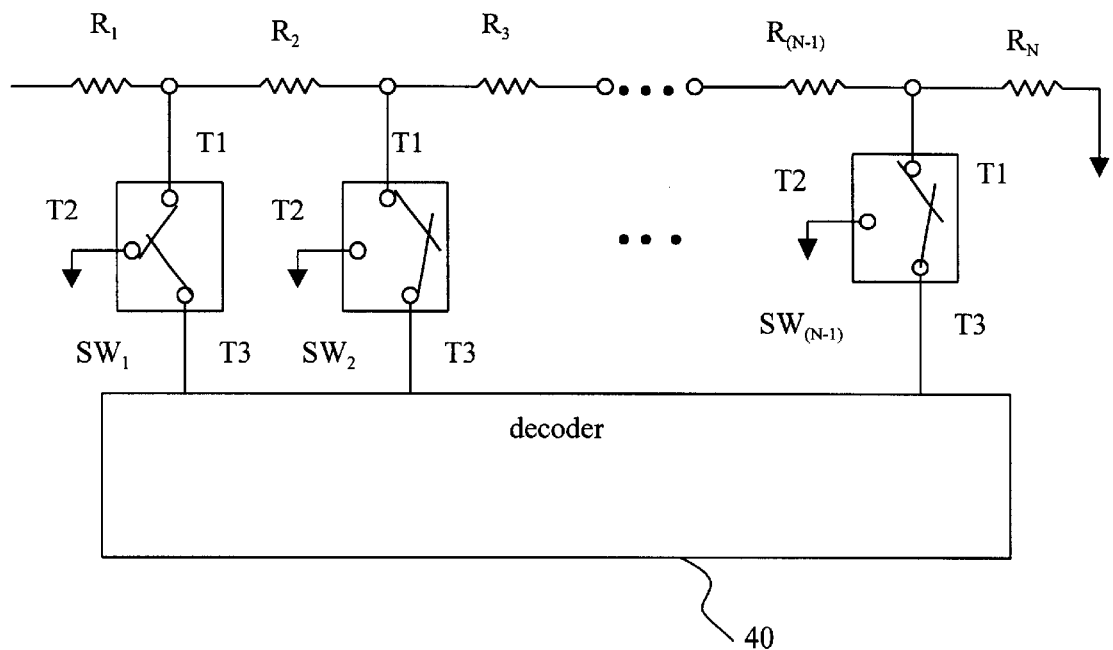
FIG. 3 illustrates the circuit diagram of the adjustable (variable) resistor employed in the control circuit to provide bias current for the programmable gain amplifier in one preferred embodiment of the present invention.
Figure 4:
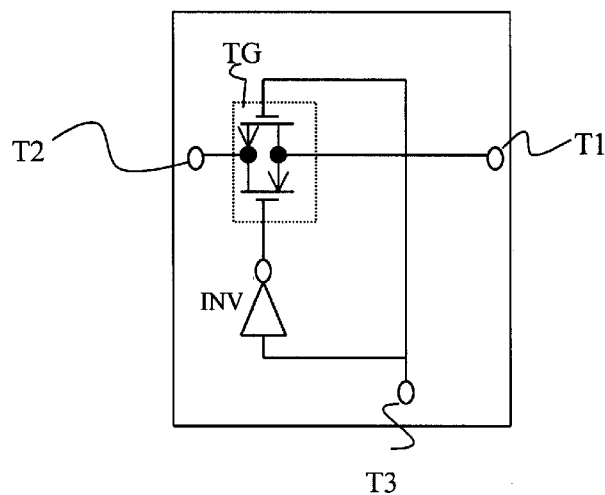
FIG. 4 illustrates the circuit diagram of the switch in the adjustable (variable) resistor employed in the control circuit in one preferred embodiment of the present invention.

The first emitter $R_{E1}$ in one preferred embodiment of the present invention is designed to be a resistor tank containing N resistors ($R_1$, $R_2$, . . . ,$R_N$), N−1 switches ($SW_1$, $SW_2$, . . . ,$SW_{N-1}$), and a decoder 40. In one preferred embodiment of the present invention, The N resistors are made of poly-silicon which has less process variation and low temperature coefficient. The first emitter resistor $R_{E1}$, which is tunable, can be designed according to FIG. 3 in the preferred embodiment of the present invention. As shown in FIG. 3, the N resistors in the first emitter resistor $R_{E1}$ are connected in series, in addition, there is a switch connected between every two resistors. According to the output signals of decoder 40, the switch can have two different states: T1 is short to T2 or T1 is opened.

Referring to FIG. 3, the first end of the first resistor R1 is connected to the emitter of transistor 01. The second end of the first resistor R1 is connected to the first end of the second resistor R2, and is connected to the first terminal T1 of the first switch $SW_1$. The second terminal T2 of the first switch $SW_1$ is electrically short to ground. The third terminal T3 of the first switch $SW_1$ is electrically coupled to one of the output lines of the decoder 40. Similarly, the first end of the second resistor R2 is connected to the second end of the first resistor R1, and is connected to the first terminal T1 of the second switch $SW_2$. The second end of the second resistor R2 is connected to the first end of the third resistor R3, and is connected to the first terminal T1 of the third switch $SW_3$. The second terminal T2 of the second and third switch is electrically shorted to ground. The third terminal T3 of the third switch $SW_3$ is electrically coupled to one of the output lines of the decoder 40. Similarly, the first end of the $N^{th}$ resistor $R_N$ is connected to the second end of the (N−1)'th resistor $R_{n-1}$, and is connected to the first terminal T1 of the (N−1)'th switch $SW_{n-1}$. The second end of the $N^{th}$ resistor $R_N$ is connected to the ground. The second terminal T2 of the (N−1)'th switch $SW_{N-1}$ is electrically shorted to ground. The third terminal T3 of the (N−1)'th switch $SW_{N-1}$ is electrically coupled to one of the plurality of control lines. The circuit diagram of the first emitter resistor $R_{E1}$ mentioned above is shown in FIG. 3.

In the preferred embodiment of the present invention, the output states of the switch is either coupled to ground or opened. The control signals of the decoder 40 are output through the N−1 control lines to the third terminal T3 of each switch. There is only one high voltage level on one of the control lines at a time, and the other control lines are of the low voltage level. Consequently, each time when the output control status changes, only one of the switches output T1 is shorted to ground, the others are in open state. Assume the output of decoder 40 makes the i'th switch output coupled to ground, and the other switches are opened. It is obvious that the resistors from $R_{i+1}$ to $R_N$ are all grounded, and the first emitter resistor $R_{E1}$ is equal to the series connection of resistors $R_1$ to $R_i$. The magnitude of collector current $I_{C1}$ of the first transistor Q1 is determined as the reference voltage $V_{BG}$ subtracts the voltage drop $V_{BE1}$ and then divided by the first emitter resistor $R_{E1}$.

Figure 5:
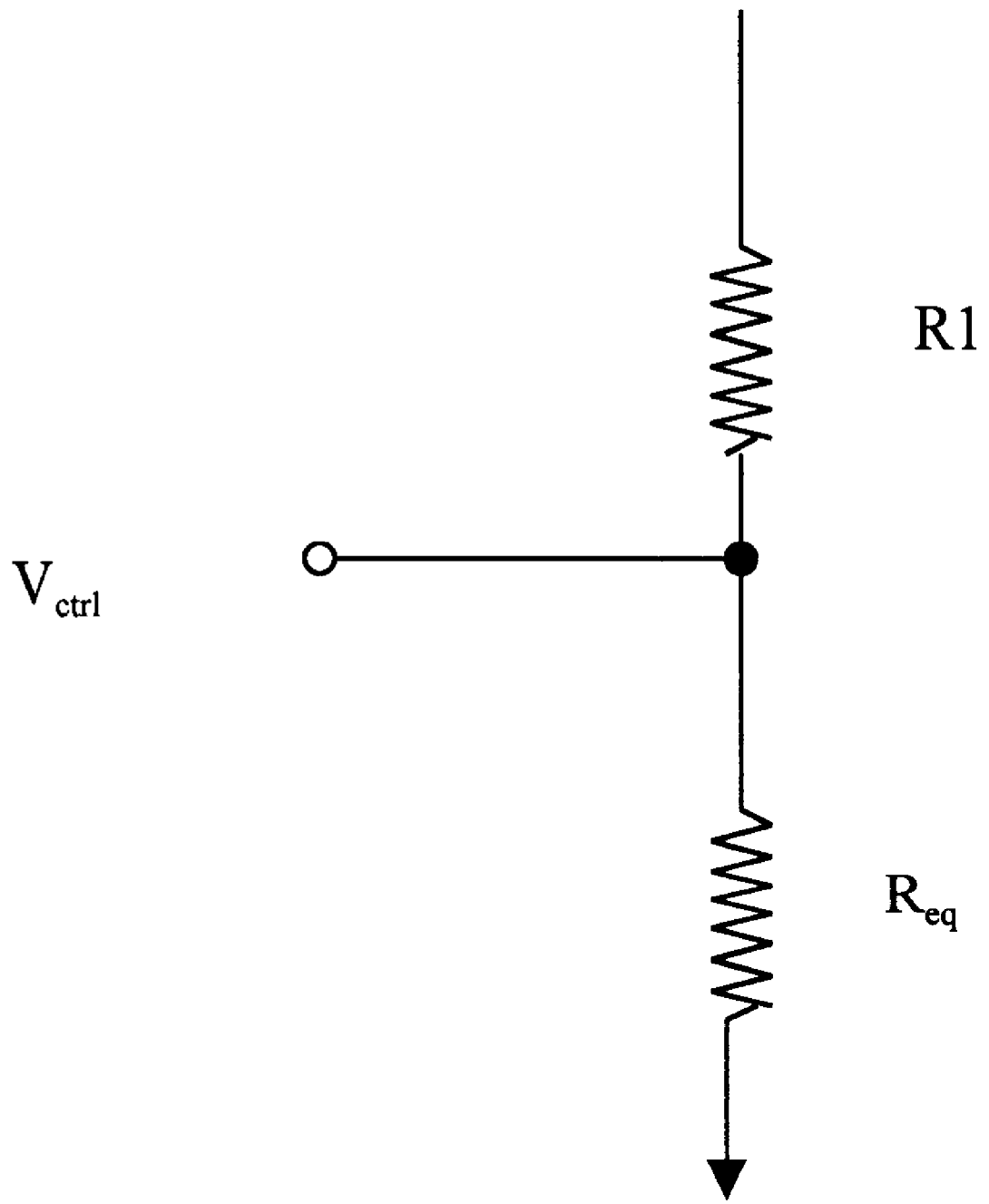
FIG. 5 illustrates the equivalent circuit diagram of the emitter resistor when a first collector current is generated in the transistor responding to control signals connected to the adjustable resistor, which is employed in the control circuit in one preferred embodiment of the present invention.

The equivalent circuit of the adjustable first emitter resistor $R_{E1}$ is shown in FIG. 5, in which the resistor $R_{eq}$ is equal to the resistance of the series-connected resistors $R_2$ to $R_i$. The voltage $V_{ctrl}$ is equal to the node voltage on the resistor $R_{eq}$. When the control signals have been varied, the resistance value of $R_{eq}$ is changed, and $V_{ctrl}$ is changed accordingly. The voltage $V_{ctrl}$ is equal to $(V_{BG}-V_{BE1})[R_{eq}/(R_1+R_{eq})]$, and the collector current $I_{C1}$ of the first transistor Q1 is equal to $V_{ctrl}$ divided by $R_{eq}$. Note that the node voltage $V_{ctrl}$ is given by the ratio of resistors $R_1$, $R_{eq}$, and their combination, the process variation has less effect on the voltage value and the current through the resistor. On the other hand, since the biasing current of the programmable gain amplifier is in proportional to the first current, and the first current $I_{C1}$ is determined by the node voltage $V_{ctrl}$, linearly control of the voltage $V_{ctrl}$ results in the linearly controlled biasing current in the PGA.

Although specific embodiments have been illustrated and described, it will be obvious to those skilled in the art that various modification may be made without departing from the spirit which is intended to be limited solely by the appended claims.

What is claimed is:

1. A control circuit for providing bias current for a programmable gain amplifier, said control circuit comprising:

reference voltage generating means for generating a reference voltage;

first current generating means for generating a first current between a first electrode and a second electrode of said first current generating means responding to said reference voltage and a first resistance of a first controlled resistor, a first control electrode of said first current generating means being coupled to said reference voltage generating means to couple said reference voltage to said first current generating means, said second electrode of said first current generating means being coupled through a first control resistor to a first voltage level, said first current generating means generating a second current responding to a second resistance of said first controlled resistor, said first controlled resistor exhibiting said first resistance responding to a first control signal, said first controlled resistor exhibiting said second resistance responding to a second control signal;

current repeating means for acting as current mirror of said first current generating means, a second control electrode of said current repeating means being coupled through a base-connecting transistor to a current repeating transistor of said programmable gain amplifier to provide a first repeating current between a third electrode and a fourth electrode of said current repeating means, said first electrode of said first current generating means and said third electrode of said current repeating means being electrically coupled to a loading current mirror to provide a current in said loading current mirror having same magnitude with said first current, said current in said loading current mirror through said third electrode and said fourth electrode acting as said first repeating current, said first repeating current through said third electrode and said fourth electrode enabling a current repeating transistor of said programmable gain amplifier generating a second repeating current, magnitude of said second repeating current being proportional to magnitude of said first repeating current as well as that of said first current, said second repeating current being provided for bias current employed in said programmable gain amplifier, when said second current being generated by said first current generating means responding to said second resistance of said first controlled resistor, magnitude of said second repeating current being proportional to magnitude of said first repeating current as well as that of said second current.

2. The control circuit as claim 1, wherein said first current generating means is a transistor, said first electrode of said first current generating means being collector of said transistor, said second electrode of said first current generating means being emitter of said transistor, said first control electrode of said first current generating means being base of said transistor.

3. The control circuit as claim 1, wherein said first control resistor is an adjustable resistor.

4. The control circuit as claim 1, wherein said first control resistor comprises:

decoding means for receiving said first control signal or said second signal to enable one of output terminals of said decoding means exhibiting a first logic level;

a plurality of serial connected resistors, a first end of a first resistor of said plurality of serial connected resistors being coupled to second electrode of said second electrode of said first current generating means; and a plurality of switches for connecting a portion of said plurality of serial connected resistors to a portion of output terminals of said decoding means, said plurality of switches connecting the other portion of said plurality of serial connected resistors to ground, first terminal of each of said plurality of switches being connected to each end of said plurality of serial connected resistors, second terminal of each of said plurality of switches being connected to ground, third terminal of each of said plurality of switches being connected to each output terminals of said decoding means, a first terminal of a first switch being coupled through a second terminal of said first switch to a third terminal of said first switch, the first terminal of the other switches of said plurality of switches being coupled to the third terminal of said plurality of switches.

5. The control circuit as claim 1, wherein said current repeating means is a transistor that fabricated under same processes with said first current generating means, said third electrode of said current repeating means being collector of said transistor, said fourth electrode of said current repeating means being emitter of said transistor, said first repeating current being collector current of said transistor, said loading current mirror being a pair of field effect transistor with gates coupled together, said gates of said pair of field effect transistor being coupled to said first electrode of said first current generating means to enable said pair of field effect transistor generate a current having the same magnitude as said first current and said first repeating current, drain of one of said pair of field effect transistor being coupled to collector of said current repeating means.

6. The control circuit as claim 1, wherein said current repeating transistor of said programmable gain amplifier being a current mirror, and being fabricated by the processes employed to fabricate said current repeating means, base of said current repeating transistor being coupled to base of said current repeating means.

7. The control circuit as claim 1, wherein said current repeating transistor of said programmable gain amplifier having base connected to said second control electrode and emitter of said base-connecting transistor.

8. A control circuit for providing bias current for a programmable gain amplifier, said control circuit comprising:

reference voltage generating means for generating a reference voltage;

first current generating means for generating a first current between a first electrode and a second electrode of said first current generating means responding to said reference voltage and a first resistance of a first controlled resistor, a first control electrode of said first current generating means being coupled to said reference voltage generating means to couple said reference voltage to said first current generating means, said second electrode of said first current generating means being coupled through a first control resistor to a first voltage level, said first current generating means generating a second current responding to a second resistance of said first controlled resistor, said first controlled resistor exhibiting said first resistance responding to a first control signal, said first controlled resistor exhibiting said second resistance responding to a second control signal, said first current generating means being a first transistor, said first electrode of said first current generating means being collector of said first transistor, said second electrode of said first current generating means being emitter of said first transistor, said first control electrode of said first current generating means being base of said first transistor;

current repeating means for being current mirror of said first current generating means, a second control electrode of said current repeating means being coupled through a base-connecting transistor to a current repeating transistor of said programmable gain amplifier to provide a first repeating current between a third electrode and a fourth electrode of said current repeating means, said first electrode of said first current generating means and said third electrode of said current repeating means being electrically coupled to a loading current mirror to provide a current in said loading current mirror having same magnitude with said first current, said current in said loading current mirror through said third electrode and said fourth electrode being said first repeating current, said first repeating current through said third electrode and said fourth electrode enabling a current repeating transistor of said programmable gain amplifier generating a second repeating current, magnitude of said second repeating current being equal to magnitude of said first repeating current and said first current, said second repeating current being provided for bias current employed in said programmable gain amplifier, said current repeating means being a second transistor that fabricated under same processes with said first current generating means, said third electrode of said current repeating means being collector of said second transistor, said fourth electrode of said current repeating means being emitter of said transistor, said first repeating current being collector current of said second transistor, said loading current mirror being a pair of field effect transistor with gates coupled together, said gates of said pair of field effect transistor being coupled to said first electrode of said first current generating means to enable said pair of field effect transistor generate a current having the magnitude proportional to that of said first current as well as said first repeating current, drain of one of said pair of field effect transistor being coupled to collector of said current repeating means, when said second current being generated by said first current generating means responding to said second resistance of said first controlled resistor, magnitude of said second repeating current being proportional to magnitude of said first repeating current as well as that of said second current.

9. The control circuit as claim 8, wherein said first transistor is composed of NPN bipolar transistor.

10. The control circuit as claim 8, wherein said first control resistor is an adjustable resistor.

11. The control circuit as claim 8, wherein said first control resistor comprises:

decoding means for receiving said first control signal or said second signal to enable one of output terminals of said decoding means exhibiting a first logic level;

a plurality of serial connected resistors, a first end of a first resistor of said plurality of serial connected resistors being coupled to second electrode of said second electrode of said first current generating means; and a plurality of switches for connecting a portion of said plurality of serial connected resistors to a portion of output terminals of said decoding means, said plurality of switches connecting the other portion of said plurality of serial connected resistors to ground, first terminal of each of said plurality of switches being connected to each end of said plurality of serial connected resistors, second terminal of each of said plurality of switches being connected to ground, third terminal of each of said plurality of switches being connected to each output terminals of said decoding means, a first terminal of a first switch being coupled through a second terminal of said first switch to a third terminal of said first switch, the first terminal of the other switches of said plurality of switches being coupled to the third terminal of said plurality of switches.

12. The control circuit as claim 8, wherein said repeating means being made of NPN bipolar transistor.

13. The control circuit as claim 8, wherein said current repeating transistor of said programmable gain amplifier being a current mirror, and being fabricated by the processes employed to fabricate said current repeating means, base of said current repeating transistor being coupled to base of said current repeating means.

14. The control circuit as claim 11, wherein said current repeating transistor of said programmable gain amplifier is composed of P channel junction field effect transistor.

15. The control circuit as claim 8, wherein said current repeating transistor of said programmable gain amplifier having base connected to said second control electrode and emitter of said base-connecting transistor.

16. A control circuit for providing bias current for a programmable gain amplifier, said control circuit comprising:

reference voltage generating means for generating a reference voltage;

first current generating means for generating a first current between a first electrode and a second electrode of said first current generating means responding to said reference voltage and a first resistance of a first controlled resistor, a first control electrode of said first current generating means being coupled to said reference voltage generating means to couple said reference voltage to said first current generating means, said second electrode of said first current generating means being coupled through a first control resistor to a first voltage level, said first current generating means generating a second current responding to a second resistance of said first controlled resistor, said first controlled resistor exhibiting said first resistance responding to a first control signal, said first controlled resistor exhibiting said second resistance responding to a second control signal, said first current generating means being a first transistor, said first electrode of said first current generating means being collector of said first transistor, said second electrode of said first current generating means being emitter of said first transistor, said first control electrode of said first current generating means being base of said first transistor, wherein said first control resistor comprises:

decoding means for receiving said first control signal or said second signal to enable one of output terminals of said decoding means exhibiting a first logic level;

a plurality of serial connected resistors, a first end of a first resistor of said plurality of serial connected resistors being coupled to second electrode of said second electrode of said first current generating means; and a plurality of switches for connecting a portion of said plurality of serial connected resistors to a portion of output terminals of said decoding means, said plurality of switches connecting the other portion of said plurality of serial connected resistors to ground, first terminal of each of said plurality of switches being connected to each end of said plurality of serial connected resistors, second terminal of each of said plurality of switches being connected to ground, third terminal of each of said plurality of switches being connected to each output terminals of said decoding means, a first terminal of a first switch being coupled through a second terminal of said first switch to a third terminal of said first switch, the first terminal of the other switches of said plurality of switches being coupled to the third terminal of said plurality of switches;

current repeating means for being current mirror of said first current generating means, a second control electrode of said current repeating means being coupled through a base-connecting transistor to a current repeating transistor of said programmable gain amplifier to provide a first repeating current between a third electrode and a fourth electrode of said current repeating means, said first electrode of said first current generating means and said third electrode of said current repeating means being electrically coupled to a loading current mirror to provide a current in said loading current mirror having same magnitude with said first current, said current in said loading current mirror through said third electrode and said fourth electrode being said first repeating current, said first repeating current through said third electrode and said fourth electrode enabling a current repeating transistor of said programmable gain amplifier generating a second repeating current, magnitude of said second repeating current being equal to magnitude of said first repeating current and said first current, said second repeating current being provided for bias current employed in said programmable gain amplifier, said current repeating means being a second transistor that fabricated under same processes with said first current generating means, said third electrode of said current repeating means being collector of said second transistor, said fourth electrode of said current repeating means being emitter of said transistor, said first repeating current being collector current of said second transistor, said loading current mirror being a pair of field effect transistor with gates coupled together, said gates of said pair of field effect transistor being coupled to said first electrode of said first current generating means to enable said pair of field effect transistor generate a current having the magnitude proportional to that of said first current as well as said first repeating current, drain of one of said pair of field effect transistor being coupled to collector of said current repeating means, when said second current being generated by said first current generating means responding to said second resistance of said first controlled resistor, magnitude of said second repeating current being proportional to magnitude of said first repeating current as well as that of said second current.

17. The control circuit as claim 16, wherein said first transistor is composed of NPN bipolar transistor.

18. The control circuit as claim 16, wherein said first control resistor is an adjustable resistor.

19. The control circuit as claim 16, wherein said repeating means being made of NPN bipolar transistor.

20. The control circuit as claim 16, wherein said current repeating transistor of said programmable gain amplifier being a current mirror, and being fabricated by the processes employed to fabricate said current repeating means, base of said current repeating transistor being coupled to base of said current repeating means.

21. The control circuit as claim 20, wherein said current repeating transistor of said programmable gain amplifier is composed of P channel junction field effect transistor.

22. The control circuit as claim 16, wherein said current repeating transistor of said programmable gain amplifier having base connected to said second control electrode and emitter of said base-connecting transistor.

* * * * *